United States Patent [19]

Smith et al.

[11] Patent Number: 4,573,756
[45] Date of Patent: Mar. 4, 1986

[54] ELECTRICAL INTERFACE ARRANGEMENTS

[75] Inventors: John L. Smith; Frank H. Jenner, both of St. Albans, England

[73] Assignee: Marconi Instruments Limited, St. Albans, England

[21] Appl. No.: 435,362

[22] Filed: Oct. 20, 1982

[30] Foreign Application Priority Data

Oct. 21, 1981 [GB] United Kingdom ............... 8131775

[51] Int. Cl.⁴ .......................................... H01R 11/18
[52] U.S. Cl. ............................ 339/117 P; 339/255 R; 339/4; 324/158 F
[58] Field of Search ............ 339/117 P, 255 R, 17 F, 339/75 MP, 176 M, 108 TP, 4; 324/158 F, 158 P

[56] References Cited

U.S. PATENT DOCUMENTS 4,307,438 12/1981 Grubb ................................ 339/4 X Primary Examiner—Z. R. Bilinsky
Attorney, Agent, or Firm—Spencer & Frank

[57] ABSTRACT

An electrical interface arrangement enables a complex circuit board to be connected to an electrical test equipment to verify the correct operation of the circuit board or to identify malfunctions. The interface arrangement makes electrical contact with predetermined points of the circuit board and connects these points to predetermined terminals of the test equipment. Each electrical interface arrangement is likely to be unique to a particular type of circuit board, and it has proved very difficult and time consuming to reliably interconnect the contacts of the electrical interface arrangement—typically 200 to 300 interconnecting leads are required. To facilitate the interconnection process, the interface arrangement is provided with a movable connector which in one position co-operates with the test equipment and which in another position is such that its terminals lie in substantially the same plane as those of the electrical contacts which, in operation, touch the predetermined locations of the circuit board. In the latter position the two sets of terminals can be interconnected very readily using a semi-automatic wiring machine.

5 Claims, 2 Drawing Figures

ELECTRICAL INTERFACE ARRANGEMENTS

BACKGROUND OF THE INVENTION

This invention relates to electrical interface arrangements which are suitable for use with apparatus for testing circuits formed as flat boards. It is becoming increasingly common to make electrical circuits in a form which is generally termed a printed circuit board, which comprises an insulating lamina with conductive tracks formed on one or both of its outer surfaces. The circuit components, such as resistors, capacitors, transistors, etc., which are electrically interconnected by means of these conductive tracks are generally mounted on only one side of the insulating lamina. Circuit boards of this kind can be very complex indeed, and special techniques are needed to thoroughly test them after manufacture to ensure that the interconnections have been correctly made, that the components are not defective, and that the circuit operates correctly in the intended manner.

One of the problems which arises in testing a printed circuit board is that of making electrical connection to predetermined locations of it in a reliable and consistent manner, and it is usually necessary to employ a special electrical interface between the test equipment and the circuit under test. The electrical interface includes a two dimensional array of contact points positioned in a predetermined pattern so that they touch, and make electrical connection with, specified locations of the conductive tracks carried by the circuit board. The electrical interface arrangement is not usually permanently attached to the test equipment, but it is instead usual to link it via a detachable electrical connector, such as a plug and socket arrangement, and the position of the connector is generally dictated by the nature of the test equipment itself. It is necessary to provide a network of electrical interconnections between the connector and the electrical contact points. This network of the electrical interconnections can be very complex, and will usually comprise a large number of individual wire leads linking particular electrical contact points to specified terminals on the connector. Since the nature of these interconnections and the position of the electrical contacts within the two dimensional array is dictated by the circuit board to be tested, it is generally necessary to produce a network of interconnections which is unique to that circuit board. Thus, when a circuit board carrying a new circuit is to be tested, it is first necessary to manufacture an appropriate electrical interface arrangement, and in view of the complexity this can be time consuming, expensive and liable to error. The present invention seeks to provide an electrical interface arrangement in which this difficulty is reduced.

SUMMARY OF THE INVENTION

According to this invention, an electrical interface arrangement for enabling a circuit board under test to be electrically connected to test equipment includes a bed plate which carries electrical contacts which are adapted in use to contact the circuit board, and which contacts include terminals projecting from the rear surface of the bed plate; and a connector which is physically movable between a first position and a second position, so that in the first position electrical connection can be made between it and the test equipment and in the second position its terminals are held in substantially the same plane as those of the electrical contacts.

During manufacture of the electrical interface arrangement, the movable connector is brought into its second position before the electrical interconnections between the contact points and the connector are made. These interconnections are produced by means of a wiring machine which links individual lengths of wire leads as required. Machines of this kind are now commercially available, and commonly they operate to attach the ends of electrical wire leads to terminals by means of a wire wrapping technique. These machines are satisfactory only if both ends of a wire lead are to be attached to points lying in substantially the same plane, so that each point can be defined in terms of co-ordinates within that plane. Furthermore, it is generally necessary for the terminals themselves to be of an elongate shape which is perpendicular to this plane so that the end of the terminal is accessible to the wire wrapping head of the machine. The interconnection points can be entered into a store associated with the machine such that the co-ordinates of each end of each wire lead are specified. The necessary network of interconnections can then be accomplished in a very simple, reliable and automatic manner.

Preferably the circuit board is, in use, supported by a carriage plate mounted in alignment with the bed plate and which is movable towards and away from the bed plate and which is provided with apertures aligned with the electrical contacts so that the contacts project through the carriage plate when it is in a position closely adjacent to the bed plate. It will thus be apparent that apertures must be formed in both the carriage plate (to provide clearance for the electrical contacts) and in the bed plate (to enable the electrical contacts to be mounted in it) and these apertures correspond exactly to the positions of the electrical contacts, which in turn are determined by the locations on the circuit board which are to be contacted. Since the terminals of the connector are brought temporarily into the same plane as those of the electrical contacts, it enables existing electrical test equipment to be used without the need to make any major modification. In other words, it is not necessary to alter in any way the plug and socket arrangement which is between an existing test equipment and the electrical interface arrangement which is the subject of this invention.

BRIEF DESCRIPTION OF THE DRAWINGS

The invention is further described by way of example with reference to the accompanying drawing in which.

DESCRIPTION OF THE PREFERRED EMBODIMENTS

Figure 1:
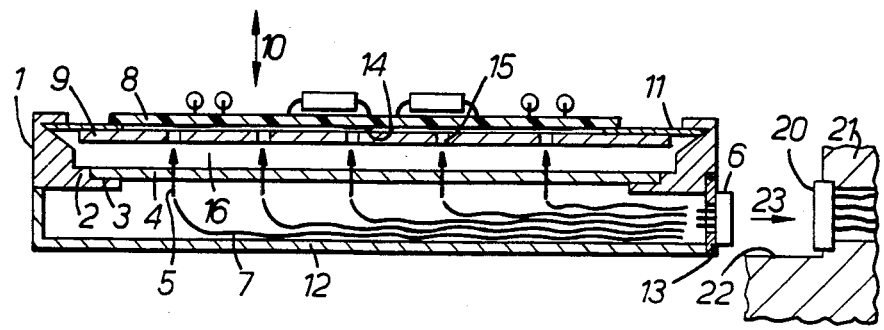
FIG. 1 illustrates a sectional side view of an interface arrangement according to the invention for use with an electrical tester for testing a flat circuit board in which the terminals are in a first position.

FIG. 1 shows the completed electrical interface arrangement of the invention in use to test a circuit board of the kind which consists of conductive tracks formed on one or both of its surfaces and which carries electrical components such as resistors and transistors on one of its surfaces. The correct operation of this circuit is verified by applying suitable electrical signals to selected locations of the circuit and monitoring whether or not the expected response is obtained. These electrical test signals, and the nature of the responses are controlled by a comprehensive test equipment, which is usually of a general purpose nature. The test equipment is instructed to apply certain signals to specified locations of the circuit board depending on the nature of the circuit board and those aspects of it which are required to be checked. Because the test equipment is a relatively large structure and is capable of being operated in a varied and comprehensive manner, the electrical interface arrangement is provided so as to enable the connections to be made to the circuit board in a unique manner, but to enable the interface arrangement itself to be plugged into the test equipment in a standard manner.

Referring to FIG. 1, the electrical interface arrangement comprises a robust housing 1 comprising four side walls (of which only two walls are visible in the sectional view). A ledge 2 runs around the inside base of the housing 1 and is provided with a recess 3 which locates a detachable bed plate 4. The bed plate 4 carries an array of electrical contacts 5, which comprises spring loaded pins which are located in individual cylindrical housings which are securely mounted within small apertures formed through the bed plate. The array of electrical contacts is connected to an interface connector 6 via a network of individual electrically conductive wire leads 7, which are each enclosed within insulating sleeves in conventional manner to prevent the occurrence of undesirable short circuits. A circuit board 8 under test rests on a carriage plate 9, which is movable towards and away from the bed plate in the direction of the double headed arrow 10. The carriage plate 9 is attached to the walls of the housing 1 by means of a flexible diaphragm 11. A detachable cover 12 encloses the wires 7 and it bears against a hinged flap 13 which carries the connector 6.

When the board 8 is to be tested, it is first placed upon the upper surface of the carriage plate 9. Its exact position upon the carriage plate 9 is of great importance, since the electrical contacts 5 must be aligned with selected locations of conductive tracks 14 carried upon the underside of the circuit board 8. When the circuit board 8 has been correctly positioned upon carriage plate 9, both the board 8 and the carriage plate 9 are lowered towards the bed plate 4 until the spring loaded contacts 5 press firmly against the underside of the board 8. The contacts 5 pass freely through small apertures 15 placed in the carriage plate 9 so as to be aligned therewith.

The circuit board 8 and the carriage plate 9 can be moved into contact with contacts 5 by any convenient means. For example, they can be moved under the action of a partial vacuum formed within a suction chamber 16 of the housing 1, or alternatively it can be moved under the action of an externally provided pressure plate (not shown). These alternatives are described in our co-pending U.S. Patent Application Ser. No. 435,361. Once the electrical contacts 5 have been brought into contact with the required locations of the circuit board 8, the electrical interface as a whole is offered up to a connector 20, which forms part of the test equipment 21. This test equipment includes a shelf portion 22 on which the electrical interface arrangement can rest, and typically of the two connectors 6 and 20, one will generally be an electrical plug and the other a cooperating socket. Thus by sliding the electrical interface arrangement on the shelf 22 in the direction of the arrow 23, the circuit 8 is enabled to make good electrical connection with the test equipment 21, so that whatever electrical tests are required can be carried out.

As the circuit board 8 can be fairly large and can carry a great many different components which are interconnected by means of complex tracks 14, it is common to require the provision of a very large number of individual contacts 5, each of which are positioned at precisely predetermined locations of the bed plate 4. Typically, 200 to 300 electrical contacts might be required and each one of these must be connected by one of the wire leads 7 to a predetermined terminal of the connector 6. The invention enables these links to be provided in a simple and reliable manner by means of a conventional semi-automatic wiring machine which works most effectively when all terminals are mounted in the same plane.

Figure 2:
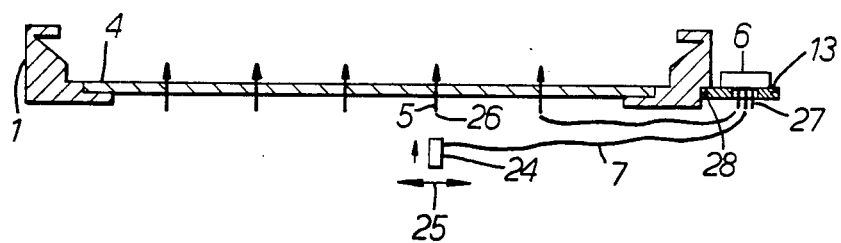
FIG. 2 shows a sectional side view of part of the electrical interface arrangement according to the invention at a stage during its manufacture in which the terminals are in a second position.

The way in which this is carried out is indicated diagrammatically in FIG. 2, in which only those parts of the electrical interface arrangement which are relevant to the present consideration are illustrated. FIG. 2 illustrates a stage during the manufacture and assembly of the electrical interface arrangement and it shows the housing 1 with only the bed plate 4 in position. The carriage plate 9 and the flexible diaphragm 11 are added at a later stage. The cover 12 is not yet present, and the hinged flap 13 has been moved so that it lies in substantially the same plane as that of the bed plate 14. This is readily achieved by positioning the axis 28 of the hinge in the plane of the bed plate 4 itself. The hinge 13 is firmly located in the position shown by means of a bracket, (which is not illustrated, but can take any convenient form). The head 24 of a semi-automatic wiring machine is movable backwards and forwards in the directions of the arrows 25, so as to align with one of the elongate terminals 26 which projects from the rear surface of the bed plate 4. When it is aligned, the wire wrapping head 24 is pushed, under the control of an operator, into contact with the terminal 26 of the contact 5 and one end of an insulated wire lead 7 is firmly attached to the terminal. Then the head 24 is withdrawn from the terminal 26 and moved in the direction of the arrow 25, until it is aligned with a selected one of the terminals 27 which form part of the connector 6. The wiring machine then attaches the other end of the wire 7 to the selected terminal 27. This process is repeated until all of the contacts 5 have been individually linked to predetermined terminals of the connector 6. It is, of course, necessary to firmly clamp the base of the wiring machine relative to the electrical interface arrangement so that the position of one is known precisely relative to that of the other. It is then merely necessary to enter the locations of the two terminals which are to be linked by one of the wire leads 7 for the interconnection to be made semi-automatically.

The use of the wiring machine results in a very considerable saving of time and effort and enables an electrical interface arrangement to be prepared for a new circuit board with the minimum of delay.

Once the electrical interconnections have been completed, the hinge 13 is unclamped from the housing 1 and returned to its vertical position (as shown in FIG. 1). It is then secured in this vertical position when the cover 12 is mounted on the underside of the housing 1.

We claim:
1. An electrical interface arrangement for establishing a plurality of electrical connections between a circuit board to be tested and electrical test equipment having a first electrical connector, said arrangement including:
- a bed plate having opposite sides;
- a plurality of electrical contacts mounted by said bed plate and projecting from one side of said bed plate for contacting selected areas of a circuit board, each said contact having an electrical terminal projecting from the other side of said bed plate, said electrical terminals collectively defining a plane;
- a second electrical connector including a plurality of electrical terminals and being pivotably mounted relative to said bed plate for movement between first and second positions, in the first position said second electrical connector being disposed for engaging the first electrical connector of the electrical test equipment and in the second position said second electrical connector being disposed so that said plurality of electrical terminals are held in a plane which is substantially coplanar with the plane defined by the terminals projecting from the other side of said bed plate; and
- electrical wire connections connecting the terminals projecting from the other side of said bed plate and said plurality of terminals of said second connector, said wire connections being formed by an automated wire wrapping machine while said second connector is disposed in the second position.

2. An arrangement as claimed in claim 1 and wherein said second electrical connector is arranged to pivot about an axis which lies in the same plane as said bed plate.

3. An arrangement as claimed in claim 1, further comprising a housing and wherein said bed plate is so mounted in said housing so as to permit access to the terminals of said electrical contacts whilst said second electrical connector is held in said second position.

4. An arrangement as claimed in claim 1, wherein in the first position of said second electrical connector the electrical terminals of said second electrical connector define a plane transverse to the plane of the terminals of said electrical contacts.

5. An arrangement as claimed in claim 4, wherein in the first position of said second electrical connector the plane defined by the electrical terminals of said second electrical connector is substantially perpendicular to the plane of the terminals of said electrical contacts.

* * * * *